United States Patent
Xia et al.

(10) Patent No.: US 8,178,944 B2
(45) Date of Patent: May 15, 2012

(54) METHOD FOR FORMING A ONE-TIME PROGRAMMABLE METAL FUSE AND RELATED STRUCTURE

(75) Inventors: Wei Xia, Irvine, CA (US); Xiangdong Chen, Irvine, CA (US); Akira Ito, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 225 days.

(21) Appl. No.: 12/456,833

(22) Filed: Jun. 22, 2009

(65) Prior Publication Data

US 2010/0320561 A1 Dec. 23, 2010

(51) Int. Cl.
*H01L 29/00* (2006.01)
(52) U.S. Cl. .................. 257/529; 257/209; 257/E23.149
(58) Field of Classification Search .................. 257/208, 257/209, 529, E23.146, E23.149, E23.15
See application file for complete search history.

(56) References Cited

U.S. PATENT DOCUMENTS

| 7,943,493 | B2* | 5/2011 | Chidambarrao et al. ...... 438/479 |
| 8,004,060 | B2* | 8/2011 | Kim et al. ..................... 257/529 |
| 2008/0258256 | A1* | 10/2008 | Otsuka et al. ................. 257/529 |
| 2008/0277756 | A1* | 11/2008 | Min et al. ...................... 257/529 |
| 2010/0301417 | A1* | 12/2010 | Cheng et al. .................. 257/355 |

* cited by examiner

*Primary Examiner* — Matthew E Warren
(74) *Attorney, Agent, or Firm* — Farjami & Farjami LLP

(57) ABSTRACT

According to one exemplary embodiment, a method for forming a one-time programmable metal fuse structure includes forming a metal fuse structure over a substrate, the metal fuse structure including a gate metal segment situated between a dielectric segment and a polysilicon segment, a gate metal fuse being formed in a portion of the gate metal segment. The method further includes doping the polysilicon segment so as to form first and second doped polysilicon portions separated by an undoped polysilicon portion where, in one embodiment, the gate metal fuse is substantially co-extensive with the undoped polysilicon portion. The method can further include forming a first silicide segment on the first doped polysilicon portion and a second silicide segment on the second doped polysilicon portion, where the first and second silicide segments form respective terminals of the one-time programmable metal fuse structure.

19 Claims, 6 Drawing Sheets

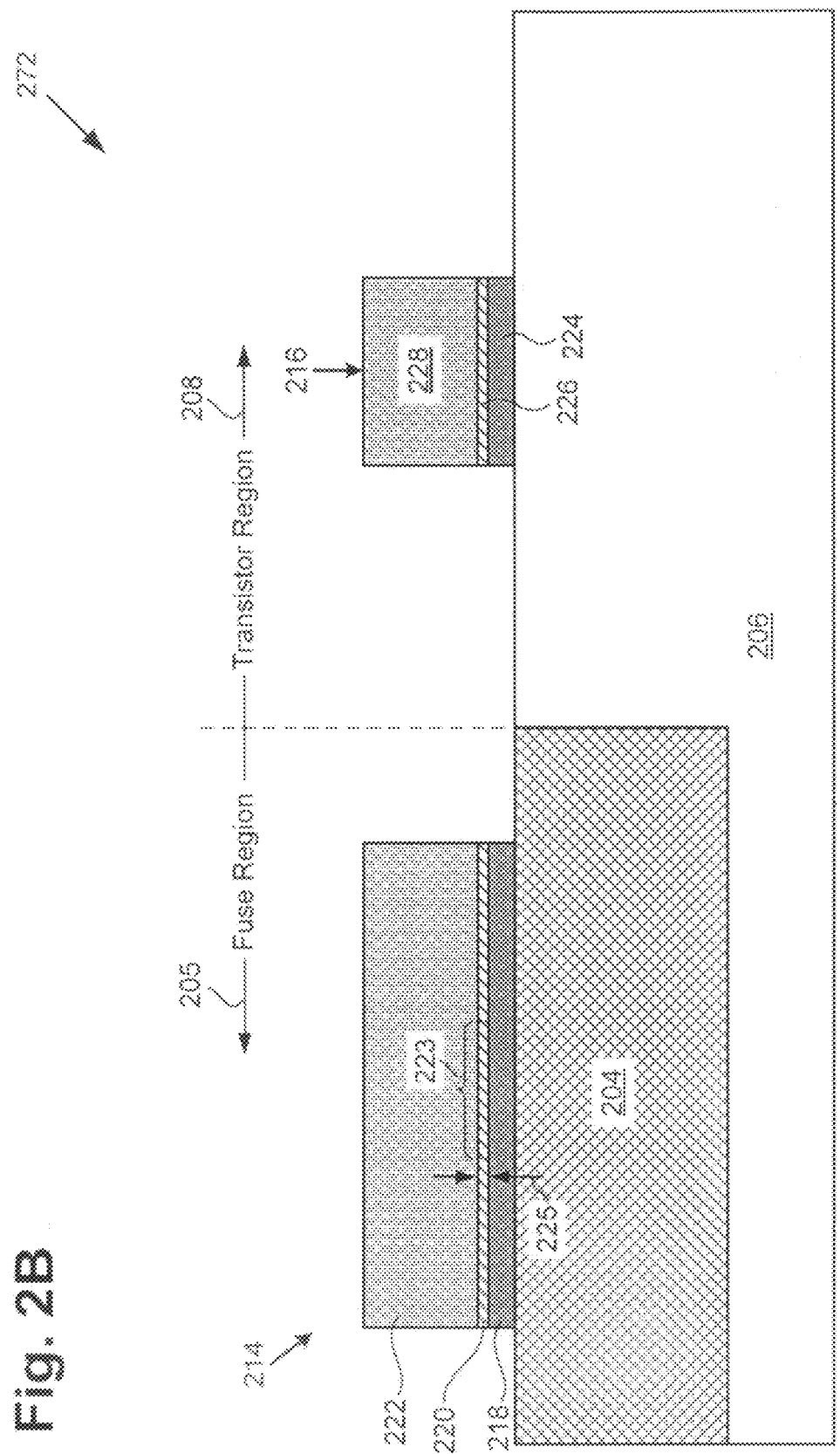

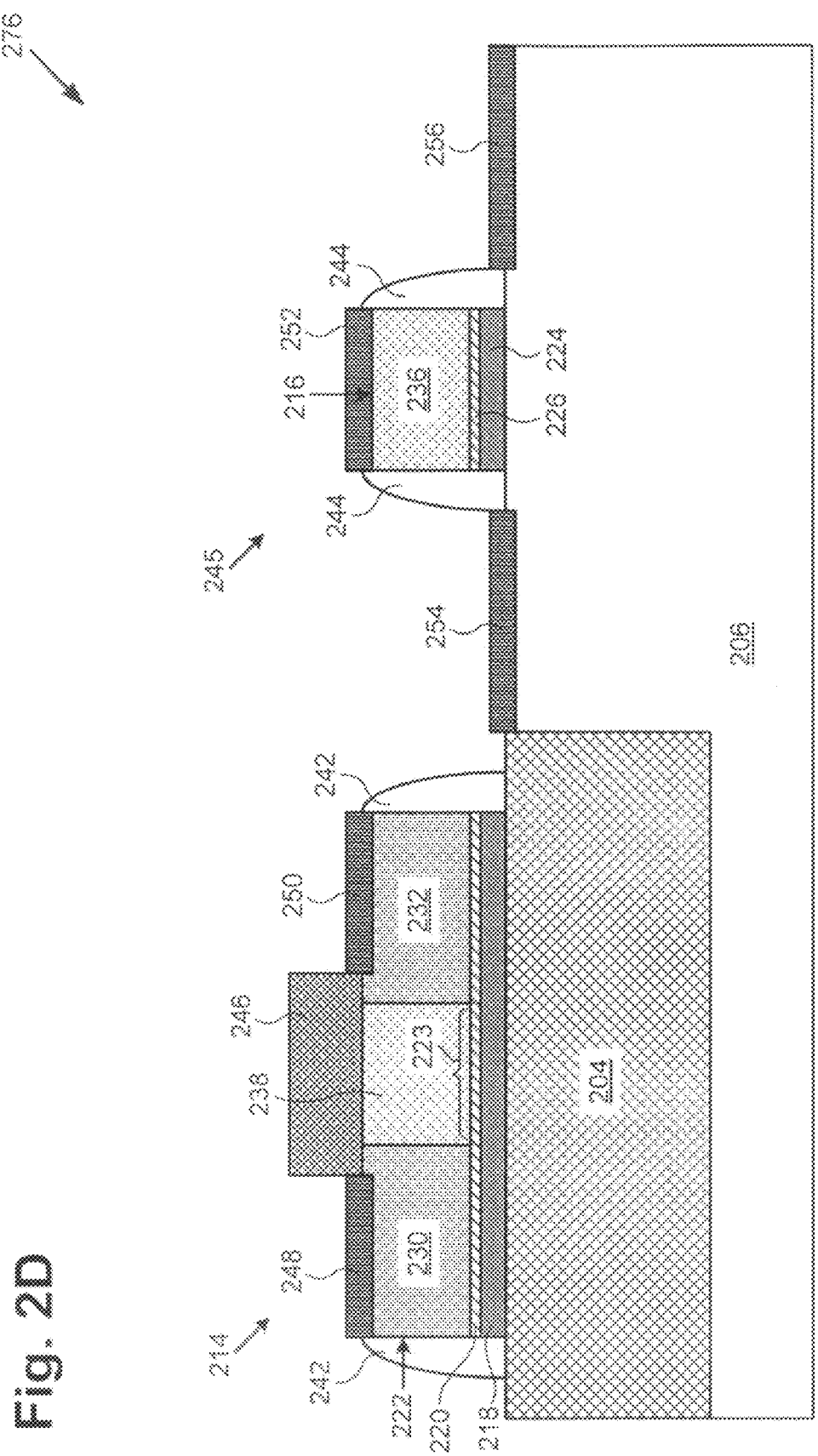

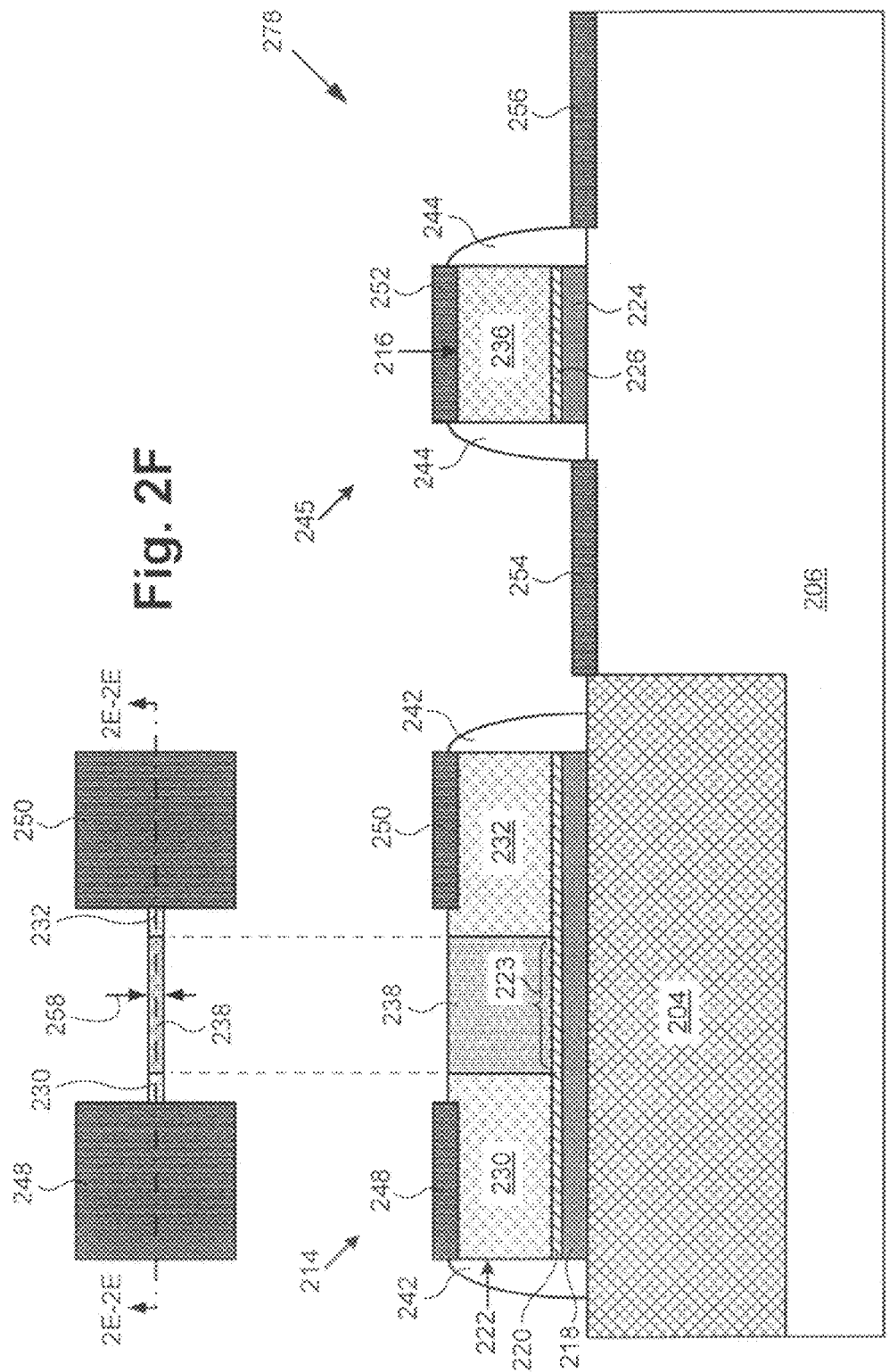

US 8,178,944 B2

METHOD FOR FORMING A ONE-TIME PROGRAMMABLE METAL FUSE AND RELATED STRUCTURE

BACKGROUND OF THE INVENTION

1. Field of the Invention

The present invention is generally in the field of semiconductors. More particularly, the invention is in the field of fuse structures used in semiconductor dice.

2. Background Art

One-time programmable cell structures, which can be programmed only once, can be generally utilized in any integrated circuit (IC) chip for storing information that is to be retained when the cells are no longer supplied with power. For example, one-time programmable cell structures can be utilized for storing information related to device identification, characteristics, and fabrication processes. A one-time programmable cell structure is typically programmed in a programming operation that irreversibly alters a portion of the cell structure.

Conventional one-time programmable cell structures have utilized mechanisms such as gate oxide breakdown and hot carrier injection to provide programmability. However, gate oxide breakdown and hot carrier injection can require a high voltage, which, in turn, can require a charge pump and associated circuitry. The charge pump and the associated circuitry for providing the necessary high voltage can undesirably increase power consumption, complexity, and cost. Silicide and interconnect metal fuses have also been utilized in conventional one-time programmable cell structures to provide programmability. However, silicide and interconnect metal fuses can require an undesirably high programming current.

SUMMARY OF THE INVENTION

A method for forming a one-time programmable metal fuse and related structure are provided. Features, advantages and various embodiments of the present invention are shown in and/or described in connection with at least one of the drawings, as set forth more completely in the claims.

BRIEF DESCRIPTION OF THE DRAWINGS

FIG. 2B illustrates a cross-sectional view, which includes a portion of a wafer processed according to an embodiment of the invention, corresponding to an intermediate step in the flowchart in FIG. 1.

FIG. 2D illustrates a cross-sectional view, which includes a portion of a wafer processed according to an embodiment of the invention, corresponding to an intermediate step in the flowchart in FIG. 1.

FIG. 2E illustrates a cross-sectional view, which includes a portion of a wafer processed according to an embodiment of the invention, corresponding to a final step in the flowchart in FIG. 1.

FIG. 2F illustrates a top view of a portion of the exemplary structure shown in FIG. 2E.

DETAILED DESCRIPTION OF THE INVENTION

The present invention is directed to a method for forming a one-time programmable metal fuse and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
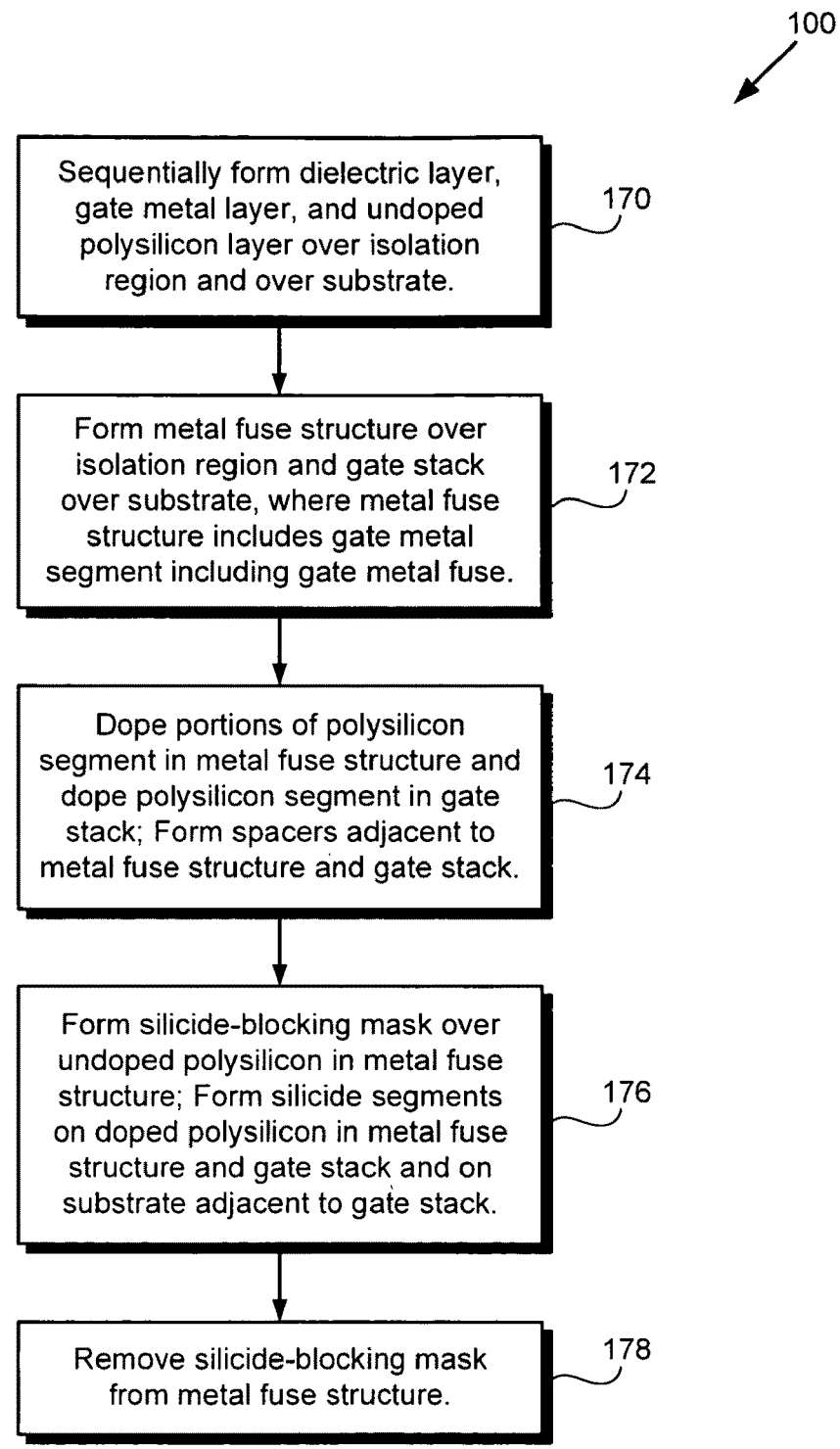
FIG. 1 shows a flowchart illustrating the steps taken to implement an embodiment of the present invention.

FIG. 1 shows a flow chart illustrating a method according to an embodiment of the present invention. Certain details and features have been left out of flowchart 100 that are apparent to a person of ordinary skill in the art. For example, a step may consist of one or more substeps or may involve specialized equipment or materials, as known in the art. Steps 170 through 178 indicated in flowchart 100 are sufficient to describe one embodiment of the present invention; however, other embodiments of the invention may utilize steps different from those shown in flowchart 100. It is noted that the processing steps shown in flowchart 100 are performed on a portion of processed wafer, which, prior to step 170, includes, among other things, a substrate, such as a silicon substrate, and an isolation region, such as a shallow trench isolation (STI) region, formed in the substrate. The wafer is also referred to simply as a wafer or a semiconductor die or simply a die in the present application.

Moreover, structures 270 through 278 in FIGS. 2A through 2E illustrate the result of performing steps 170 through 178 of flowchart 100, respectively. For example, structure 270 shows a semiconductor structure after processing step 170, structure 272 shows structure 270 after the processing of step 172, structure 274 shows structure 272 after the processing of step 174, and so forth.

Figure 2A:
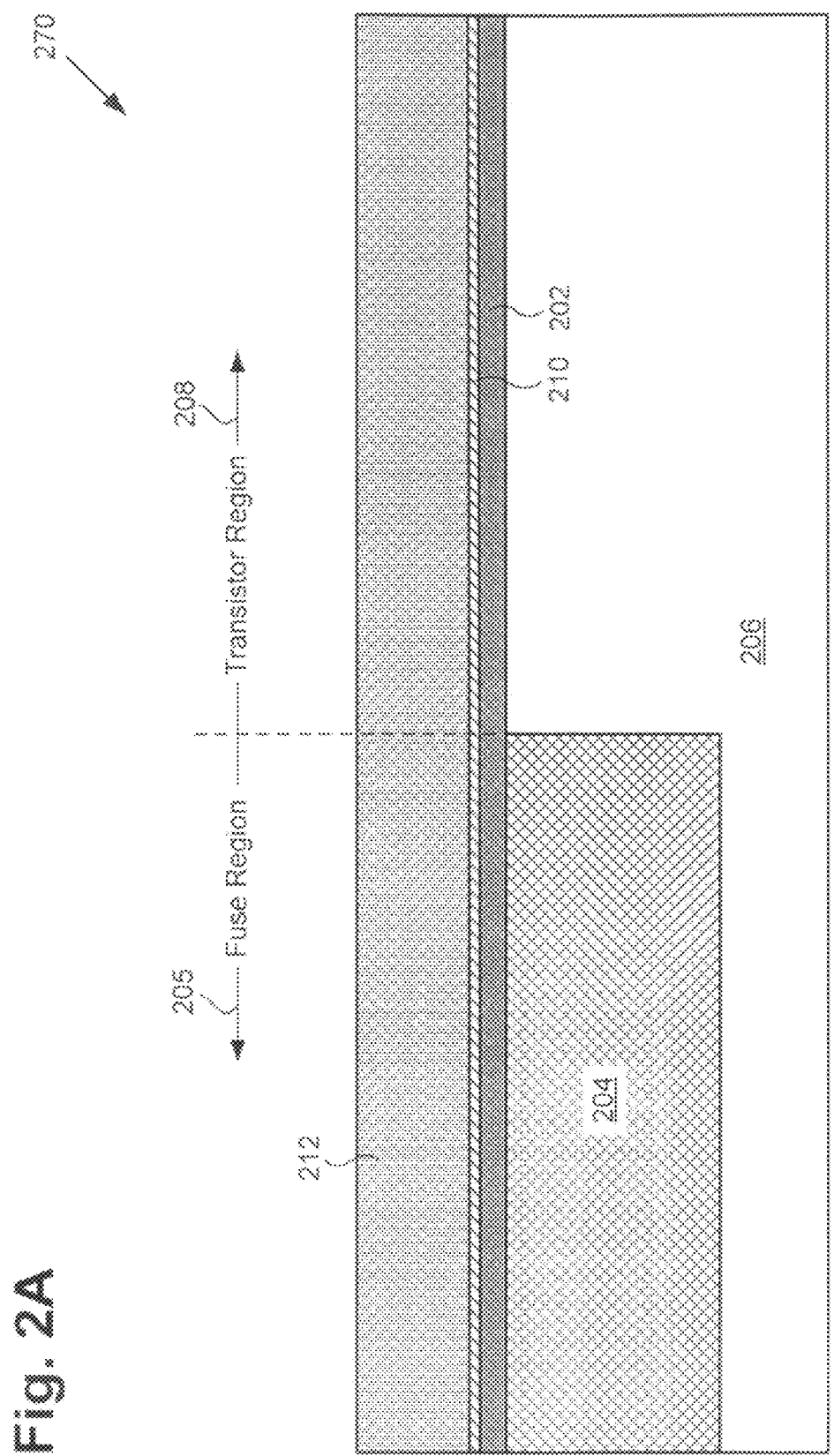
FIG. 2A illustrates a cross-sectional view, which includes a portion of a wafer processed according to an embodiment of the invention, corresponding to an initial step in the flowchart in FIG. 1.

Referring now to step 170 in FIG. 1 and structure 270 in FIG. 2A, at step 170 of flowchart 100, dielectric layer 202 is formed over isolation region 204 in fuse region 205 of substrate 206 and over substrate 206 in transistor region 208 of substrate 206, gate metal layer 210 is formed over dielectric layer 202, and polycrystalline silicon (polysilicon) layer 212 is formed over gate metal layer 210. Isolation region 204 can be, for example, an STI region. Dielectric layer 202 can comprise, for example, a dielectric material having a high dielectric constant (high-k), such as hafnium oxide (HfO), zirconium oxide (ZrO), or other type of metal oxide. In one embodiment, dielectric layer 202 can comprise a dielectric material other than a high-k dielectric material, such as, for example, silicon oxide. However, for process technologies below 32.0 nanometer (nm), dielectric layer 202 necessarily comprises a high-k dielectric material. Dielectric layer 202 can be formed by utilizing a chemical vapor deposition (CVD) process or other deposition process to deposit a layer of dielectric material over isolation region 204 and substrate 206.

Gate metal layer 210 can comprise, for example, a metal stack including titanium nitride (TiN) or tantalum nitride (TaN), or other metallic material or metal stack that is suitable for use in a transistor gate. Metal layer 210 can have a thickness of, for example, between approximately 30.0 Angstroms and approximately 200.0 Angstroms and can be formed over dielectric layer 202 be utilizing a physical vapor deposition (PVD) process or other deposition process. Polysilicon layer 212 can comprise undoped polysilicon and can be formed by utilizing a low pressure chemical vapor deposition (LPCVD) process or other deposition process to deposit a layer of polysilicon over metal layer 210. The result of step 170 of flowchart 100 is illustrated by structure 270 in FIG. 2A.

Referring to step 172 in FIG. 1 and structure 272 in FIG. 2B, at step 172 of flowchart 100, one-time programmable metal fuse structure 214 (also referred to simply as "metal fuse structure 214" in the present application) is formed over isolation region 204 and gate stack 216 is formed over substrate 206. Metal fuse structure 214 comprises dielectric segment 218, which is situated over isolation region 204, gate metal segment 220, which is situated over dielectric segment 218, and polysilicon segment 222, which is situated over gate metal segment 220. Gate metal segment 220 includes gate metal fuse 223, which is formed in a central portion of gate metal segment 220. Gate metal fuse 223 has thickness 225, which can be, for example, between approximately 30.0 Angstroms and approximately 200.0 Angstroms. Gate metal fuse 223 has a width (not shown in FIG. 2B) that can be, for example, approximately equal to a minimum width allowed by the process technology. The width of gate metal fuse 223 will be discussed below in relation to FIG. 2F.

Gate stack 216 comprises dielectric segment 224, which is situated over substrate 206, metal segment 226, which is situated over dielectric segment 224, and polysilicon segment 228, which is situated over metal segment 226. Metal fuse structure 214 and gate stack 216 can be formed by appropriately patterning dielectric layer 202, gate metal layer 210, and polysilicon layer 212 in a patterning process, which can include appropriate masking and etching steps. The result of step 172 of flowchart 100 is illustrated by structure 272 in FIG. 2B.

Figure 2C:
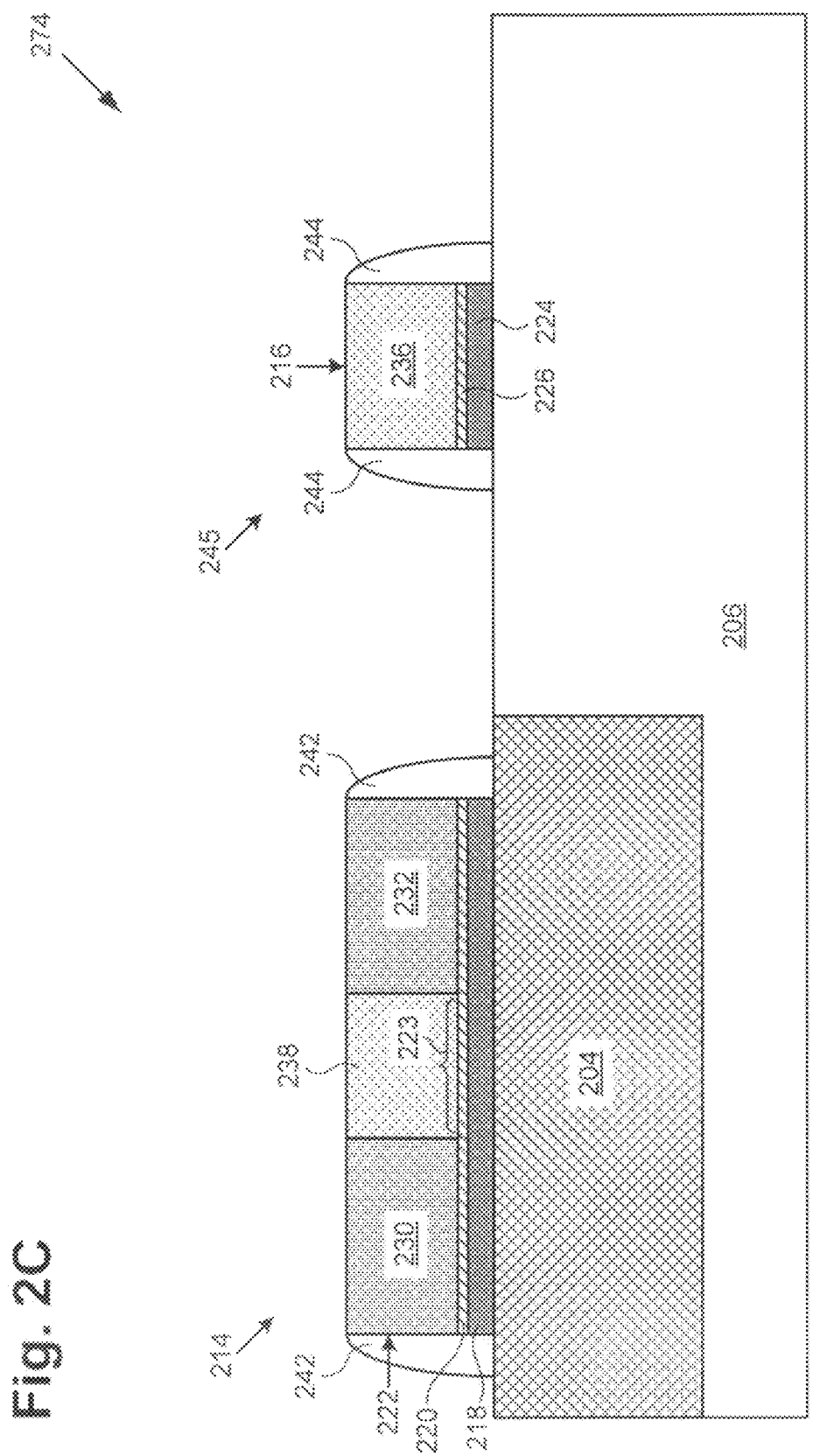
FIG. 2C illustrates a cross-sectional view, which includes a portion of a wafer processed according to an embodiment of the invention, corresponding to an intermediate step in the flowchart in FIG. 1.

Referring to step 174 in FIG. 1 and structure 274 in FIG. 2C, at step 174 of flowchart 100, doped polysilicon portions 230 and 232 are formed in polysilicon segment 222 of metal fuse structure 214 and doped polysilicon segment 236 is formed in gate stack 216. Undoped polysilicon portion 238 is situated between doped polysilicon portions 230 and 232 of polysilicon segment 222 in metal fuse structure 214 and doped polysilicon segment 236 is situated over gate metal segment 226 of gate stack 216. Undoped polysilicon portion 238 also overlies gate metal fuse 223 in gate metal segment 220. In the present embodiment, undoped polysilicon portion 238 is substantially co-extensive with gate metal fuse 223. Doped polysilicon portions 230 and 232 and doped polysilicon segment 236 can be formed by, for example, forming a mask over substrate 206 and implanting an appropriate dopant into unmasked portions of polysilicon segment 222 and gate stack 216. In one embodiment, the dopant can be an N type dopant. In another embodiment, the dopant can be a P type dopant. The mask can be formed by depositing and appropriately patterning a layer of masking material, such as photoresist.

Also, at step 174 of flowchart 100, spacers 242 are formed adjacent to opposing sides of metal fuse structure 214 and spacers 244 are formed adjacent to opposing sides of gate stack 216. Spacers 242 and 244 can comprise a spacer dielectric material, such as, for example, silicon oxide, and can be formed in a manner known in the art. Source/drain regions (not shown in FIG. 2C) can also be formed in substrate 206 adjacent to gate stack 216 at step 174 of flowchart 100, thereby forming transistor 245, which includes gate structure 216. Transistor 245 can be a field effect transistor (FET), such as a MOSFET. The result of step 174 of flowchart 100 is illustrated by structure 274 in FIG. 2C.

Referring to step 176 in FIG. 1 and structure 276 in FIG. 2D, at step 176 of flowchart 100, silicide-blocking mask 246 is formed over undoped polysilicon portion 238 of metal fuse structure 214, silicide segments 248 and 250 are formed on respective doped polysilicon portions 230 and 232 of polysilicon segment 222 of metal fuse structure 214, silicide segment 252 is formed on doped polysilicon segment 236 of gate stack 216, and silicide segments 254 and 256 are formed on substrate 206 adjacent to gate stack 216. Silicide-blocking mask 246 is situated over undoped polysilicon portion 238 and overlaps doped polysilicon portions 230 and 232 so as to ensure that silicide is not formed on undoped polysilicon portion 238. Silicide-blocking mask 246 can comprise silicon nitride or other silicide-blocking material and can be formed by, for example, depositing and appropriately patterning a layer of silicon nitride over undoped polysilicon portion 238 of polysilicon segment 222.

In an embodiment of the invention, additional processing required to form silicide-blocking mask 246 can be avoided by combining the formation of a silicide-blocking mask for fuse structure 214 with formation of a conventional silicide-blocking mask utilized in the formation of an unsalicided polysilicon resistor. Silicide segments 248 and 250 are situated on respective doped polysilicon portions 230 and 232 of fuse structure 214, silicide segment 252 is situated on doped polysilicon segment 236 of gate stack 216, and silicide segments 254 and 256 are situated on substrate 206 adjacent to spacers 244. Silicide segments 248 and 250 can extend above respective doped polysilicon portions 230 and 232 and can form respective terminals of metal fuse structure 214. For example, silicide segment 248 can form a positive terminal (i.e. an anode) of metal fuse structure 214 and silicide segment 250 can form a negative terminal (i.e. a cathode) of metal fuse structure 214. The result of step 176 of flowchart 100 is illustrated by structure 276 in FIG. 2D.

Referring to step 178 in FIG. 1 and structure 278 in FIG. 2E, at step 178 of flowchart 100, silicide-blocking mask 246 (shown in FIG. 2D) is removed from metal fuse structure 214. Silicide-blocking mask 246 can be removed by utilizing a suitable etch process as is known in the art. The result of step 178 of flowchart 100 is illustrated by structure 278 in FIG. 2E.

FIG. 2F shows a top view of a portion of structure 278, where the cross-sectional view of the portion of structure 278 in FIG. 2E is across line 2E-2E in FIG. 2F. In particular, undoped polysilicon portions 230 and 232, doped polysilicon portion 238, and silicide segments 248 and 250 correspond to the same elements in FIG. 2E and FIG. 2F. As shown in FIG. 2F, gate metal fuse 223, which underlies undoped polysilicon portion 238 of polysilicon segment 222, has width 258. Width 258 can be, for example, approximately equal to a minimum width allowed by the process technology utilized to form metal fuse structure 214 and gate stack 216. For example, width 258 can be approximately equal to 45.0 nm for a 45.0 nm process technology. approximately equal to 28.0 nm for a 28.0 m process technology, and so forth. In one embodiment, width 258 of gate metal fuse 223 is not greater than approximately 40.0 nm. In another embodiment, width 258 of gate metal fuse 223 is not greater than approximately 32.0 nm.

In metal fuse structure 214, gate metal segment 220, which includes gate metal fuse 223, can have a resistance of, for example, approximately 10.0 ohms per square to approximately 100.0 ohms per square. In contrast, undoped polysilicon portion 238 of polysilicon segment 222 can have a substantially higher resistance of approximately 2000.0 ohms per square.

Metal fuse structure 214 can be programmed by causing a sufficient amount of current to flow between terminals 248 and 250 so as to cause gate metal fuse 223 to blow open. Thus, after programming, since gate metal fuse 223 is open, current flowing between terminals 248 and 250 of metal fuse structure 214 must flow through doped polysilicon portions 230 and 232 and undoped polysilicon portion 238 of polysilicon segment 218, thereby causing metal fuse structure 214 to have a high resistance between terminals 248 and 250. However, prior to programming, i.e., before gate metal fuse 223 has been blown, current can flow between terminals 248 and 250 of metal fuse structure 214 via doped polysilicon portions 230 and 232 of polysilicon segment 222 and gate metal fuse 223, thereby causing metal fuse structure 214 to have a low resistance between terminals 248 and 250. The low resistance of metal fuse structure 214 prior to programming can be associated with a logic state of "0" and the high resistance of metal fuse structure 214 after programming can be associated with a logic state of "1", or vice versa.

Since gate metal is utilized to form a metal fuse in the present invention, the invention's gate metal fuse can have a very small width and thickness. For example, an embodiment of the invention's gate metal fuse can have a width of less than approximately 40.0 nm and a thickness of less than approximately 20.0 nm. As a result, the invention's gate metal fuse can be fused (i.e. blown) in a programming operation by utilizing a very small current, which can be advantageously provided by a small-size FET. Also, since the invention's gate metal fuse has a very small size, less residue that can undesirably affect neighboring areas remains after the gate metal fuse has been fused (i.e. blown) in a programming operation.

In contrast to the present invention, a conventional one-time programmable silicide fuse structure that is formed in a metal gate process can require an additional mask to remove the gate metal that is utilized to form the metal gate, which can undesirably increase processing cost. Also, in the conventional one-time programmable silicide fuse structure, a substantially higher programming current can be required to fuse the silicide compared to the programming current required to blow the gate metal in an embodiment of the invention's one-time programmable metal fuse structure.

Thus, as discussed above, by utilizing a gate metal fuse, an embodiment of the invention can provide a one-time programmable metal fuse structure that can be advantageously programmed by utilizing a very small programming current, which can be advantageously provided by a small-size FET. Also, as discussed above, by utilizing a gate metal fuse, an embodiment of the invention can provide a one-time programmable metal fuse structure that can be formed in a high-k metal gate process for advanced process technologies, such as, for example, 32.0 nm or 28.0 nm process technologies, without requiring an additional mask, thereby advantageously reducing processing cost.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A one-time programmable metal fuse structure comprising:
    a gate metal fuse situated in a portion of a gate metal segment over a substrate;
    a polysilicon segment situated over said gate metal fuse, said polysilicon segment comprising an undoped polysilicon portion situated between first and second doped polysilicon portions.

2. The one-time programmable metal fuse structure claim 1, wherein said gate metal segment is situated between a dielectric segment and said polysilicon segment.

3. The one-time programmable metal fuse structure claim 1, wherein said gate metal fuse is substantially co-extensive with said undoped polysilicon portion.

4. The one-time programmable metal fuse structure claim 2, wherein said dielectric segment comprises a high-k dielectric material.

5. The one-time programmable metal fuse structure of claim 4, wherein said high-k dielectric material is selected from the group consisting of hafnium oxide and zirconium oxide.

6. The one-time programmable metal fuse structure claim 1 further comprising a first silicide segment situated over said first doped polysilicon portion and a second silicide segment situated over said second doped polysilicon portion, wherein said first and second silicide segments form respective terminals of said one-time programmable metal fuse structure.

7. The one-time programmable metal fuse structure claim 1, wherein said gate metal fuse has a thickness of between approximately 30.0 Angstroms and approximately 200.0 Angstroms.

8. The one-time programmable metal fuse structure claim 1, wherein said gate metal fuse has a width of less than approximately 40.0 nanometers.

9. The one-time programmable metal fuse structure claim 1, wherein said gate metal fuse comprises a metal selected from the group consisting of titanium nitride and tantalum nitride.

10. A one-time programmable metal fuse structure comprising:
    a gate metal fuse situated in a portion of a gate metal segment over a substrate;
    a polysilicon segment situated over said gate metal fuse, said polysilicon segment comprising an undoped polysilicon portion situated between first and second doped polysilicon portions;
    a first silicide segment situated over said first doped polysilicon portion wherein said first silicide segment forms a terminal of said one-time programmable metal fuse structure.

11. The one-time programmable metal fuse structure of claim 10 further comprising a second silicide segment situated over said second doped polysilicon portion, wherein said first and second silicide segments form respective terminals of said one-time programmable metal fuse structure.

12. The one-time programmable metal fuse structure claim 10, wherein said gate metal segment is situated between a dielectric segment and said polysilicon segment.

13. The one-time programmable metal fuse structure claim 10, wherein said gate metal fuse is substantially co-extensive with said undoped polysilicon portion.

14. The one-time programmable metal fuse structure claim 12, wherein said dielectric segment comprises a high-k dielectric material.

15. The one-time programmable metal fuse structure of claim 14, wherein said high-k dielectric material is selected from the group consisting of hafnium oxide and zirconium oxide.

16. The one-time programmable metal fuse structure claim 10, wherein said gate metal fuse comprises a metal selected from the group consisting of titanium nitride and tantalum nitride.

17. A one-time programmable metal fuse structure comprising:
   a gate metal fuse situated in a portion of a gate metal segment over a substrate;
   a polysilicon segment situated over said gate metal fuse, said polysilicon segment comprising an undoped polysilicon portion situated between first and second doped polysilicon portions, and wherein said gate metal segment is situated between a dielectric segment and said polysilicon segment;
   a first silicide segment situated over said first doped polysilicon portion wherein said first silicide segment forms a terminal of said one-time programmable metal fuse structure.

18. The one-time programmable metal fuse structure claim 17, wherein said dielectric segment comprises a high-k dielectric material.

19. The one-time programmable metal fuse structure of claim 18, wherein said high-k dielectric material is selected from the group consisting of hafnium oxide and zirconium oxide.

* * * * *